US006104603A

United States Patent [19]

Wang

[11] Patent Number: 6,104,603

[45] Date of Patent: Aug. 15, 2000

[54] ELECTRONIC PEN CALCULATOR

[76] Inventor: Den-Fuw Wang, No. 306, Wen Hua Rd. Sec. 1, Pan Chiao City, Taipei Hsien, Taiwan

[21] Appl. No.: 09/225,692

[22] Filed: Jan. 6, 1999

[51] Int. Cl.[7] ................................ H05K 5/00; H05K 7/00

[52] U.S. Cl. ....................................... 361/679; 235/472.03

[58] Field of Search .................................... 361/679, 680, 361/681; 235/472.03

[56] References Cited

U.S. PATENT DOCUMENTS

| | | | |
|---|---|---|---|
| 5,555,157 | 9/1996 | Moller et al. | 361/679 |
| 5,939,702 | 8/1999 | Knighton et al. | 361/679 |

*Primary Examiner*—Harold I. Pitts
*Attorney, Agent, or Firm*—Bacon & Thomas, PLLC

[57] ABSTRACT

A structure of electronic pen calculator is constructed by forming two rectangular windows in upper face of a pen body for accommodating a printed circuit board and exposing a keyboard and a LCD over those two windows, wherein an inverse T-groove with a wide body and a narrow head is formed on back of the rectangular windows; top end of the pen body is sleeve-jointed with a pen cap, which is coupled to a clamping rod laterally; a protruded dot is formed on inner face at tail end of the clamping rod, and a stopping rib is disposed on opposite inner face of the pen cap; when the pen cap is sleeve-jointed onto the pen body, the stopping rib is embedded in the inverse T-groove, and the pen cap can slide to the right, left, up, or down within a regulated scope, so that the protruded dot can be positioned above any desired keys and pressed for data input; the calculated answer will be shown on the LCD; a slipping-resist sleeve is jointed to a lower end of the pen body to prevent hand from slipping when writing.

3 Claims, 4 Drawing Sheets

ELECTRONIC PEN CALCULATOR

BACKGROUND OF THE INVENTION

1. Field of the Invention

This invention relates to an electronic pen calculator, particularly to a pen calculator provided with a keyboard, wherein the keys can be positioned and pressed correctly in virtue of a movable pen cap for calculation purpose.

2. Description of the Prior Art

An electronic calculator is usually made in shape of a rectangular plate, which is light in weight and small in size especially for personal use, however, it is not so convenient as a pen in portability anyhow, and it's especially true in the case when calculating and writing both are required.

In view of the above-described imperfections, after years of constant effort in research, the inventor of this invention is taking the opportunity to propose an improved mechanism pertaining to the subject matter in the hope of doing something helpful to the human society.

SUMMARY OF THE INVENTION

This invention is proposed to provide an electronic pen calculator with two rectangular windows for a keyboard and a LCD of a printed circuit board to reside, wherein a pen cap is deposed at top end of the pen body; a clamping rod with a protruded dot at its tail end is coupled the pen cap laterally, so that, in virtue of sliding of the pen cap, the protruded dot of the clamping rod can be used to press the keys desired for data input; a calculated answer will be shown on the LCD module; a slipping-resist sleeve is provided at bottom end of the pen body to prevent from slipping when writing; a dual functional operation for writing and calculating is possible.

Another object of this invention is to provide a pen calculator, wherein a T-groove is formed on back of the windows; a stopping rib formed on inner face at bottom edge back to the clamping rod of the pen cap will be embedded in the T-groove for positioning function in order to achieve two-in-one purpose for a pen and a calculator.

An electronic pen calculator with the abovesaid merits comprises:

- a pen body, wherein two rectangular windows are formed for accommodating a printed circuit board, and on back of the windows, a groove shaped in inverse character T with a wide body and a narrow head is provided;
- a slipping-resist sleeve for preventing hand from slipping when writing;
- a pen cap having a clamping rod coupled laterally, wherein a protruded dot is formed on inner face at tail end of the clamping rod, and a stopping rib is provided at bottom edge on back side of the pen cap;
- a printed circuit board disposed in the pen body;
- a keyboard; and
- a LCD module.

BRIEF DESCRIPTION OF THE DRAWINGS

For a better understanding to the present invention, together with further advantages or features thereof, at least one preferred embodiment will be elucidated below with reference to the annexed drawings in which.

DETAILED DESCRIPTION OF THE PREFERRED EMBODIMENT

Figure 1A:
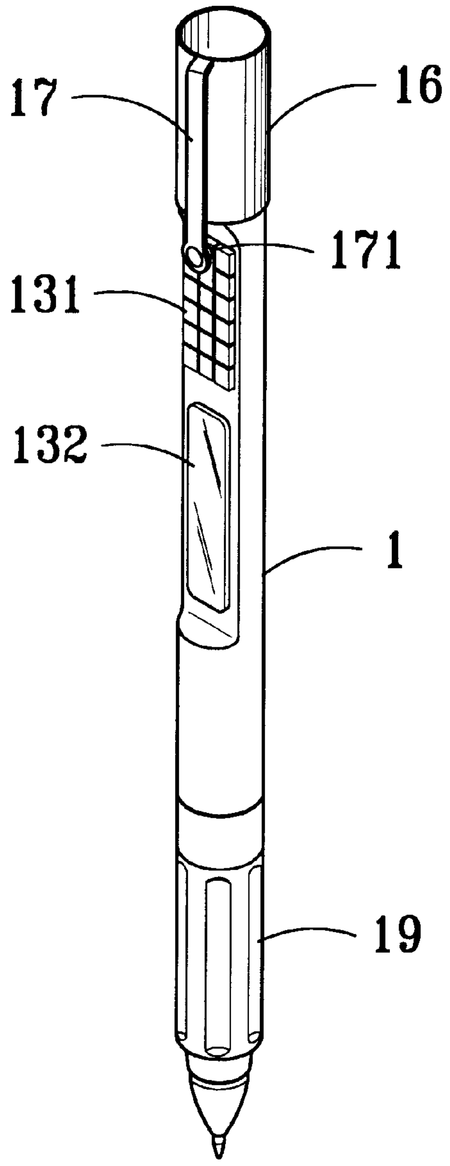
FIGS. 1A and 1B show elevational structure of an electronic pen calculator of this invention.
Figure 1B:
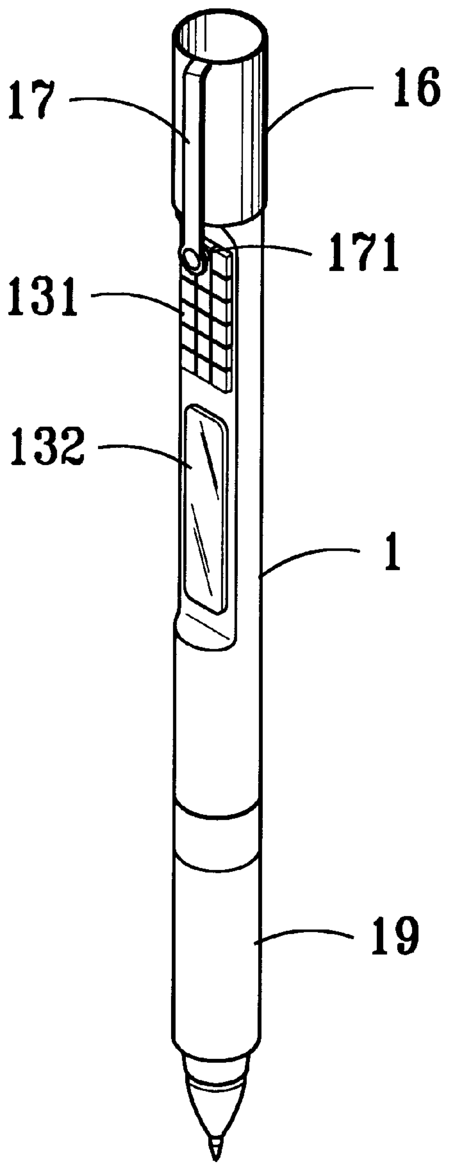
Figure 2A:
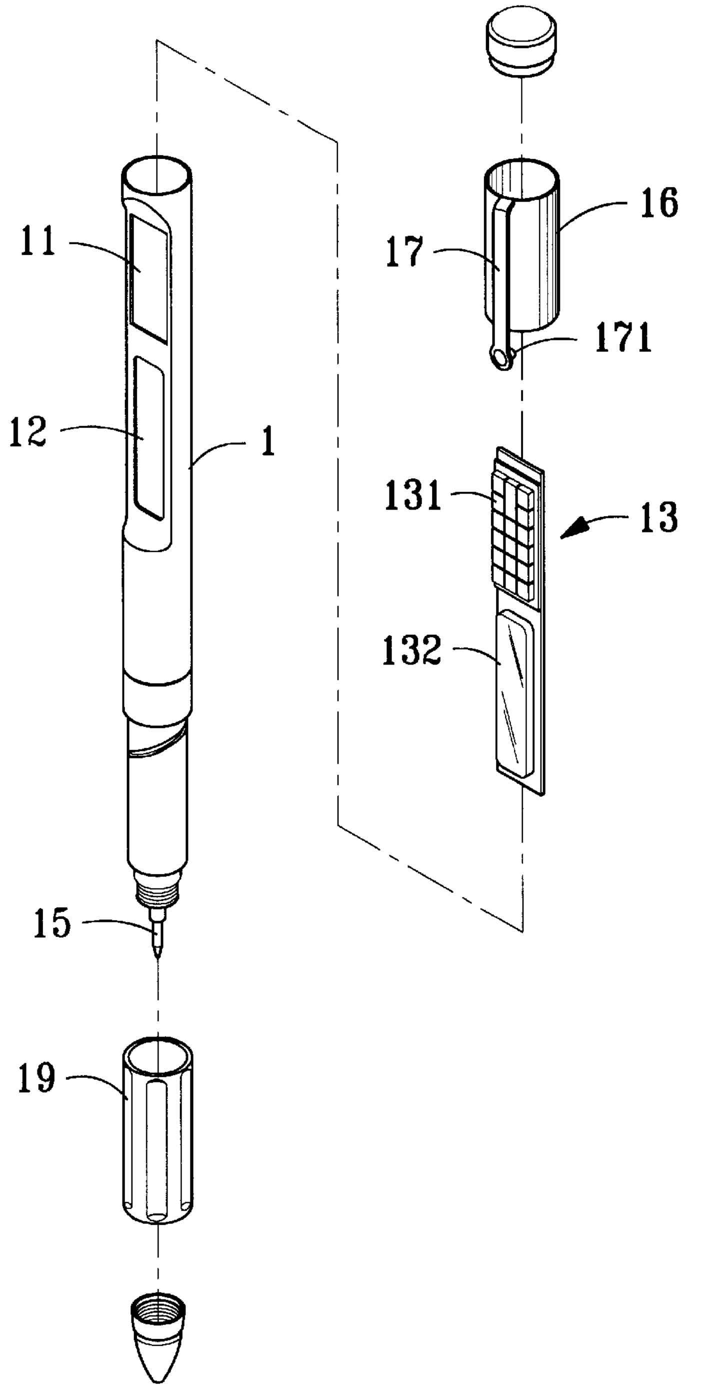
FIG. 2A and 2B show exploded structure of an electronic pen calculator of this invention.
Figure 2B:
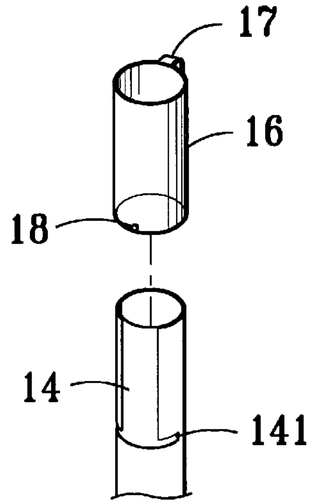

Please refer to FIG. 1A, 1B and FIG. 2A, 2B illustrating elevational and exploded structure of an electronic pen calculator of this invention. A pen body 1 is a main part of the pen calculator, wherein two aligned rectangular windows 11, 12 are formed in an upper face of the pen body 1 for a keyboard 131 and a LCD 132 of an inset printed circuit board 13 to reside; on back of the windows, a T-groove 14 is disposed, and a positioning slit 141 is extended horizontally at its lower end; a slipping-resist sleeve 19 is sleeve-jointed to the bottom end of the pen body 1, and thereinto a pen core is inserted.

The top end of the pen body 1 is sleeve-jointed with a pen cap 16, wherein a clamping rod 17 is coupled laterally to the pen cap 16; a protruded dot 171 is provided at tail end of the clamping rod 17; a stopping rib 18 formed on inner face at bottom edge back to the clamping rod 17 of the pen cap 16 will be embedded in the T-groove 14 of the pen body 1 after a sleeve joint of the pen cap 16 to the pen body 1 is made, so that the protruded dot 171 can be used to press the keys on the keyboard 131 for data input when the pen cap 16 slides to the right, left, up, or down, an answer will be displayed on the LCD 132.

Figure 3A:
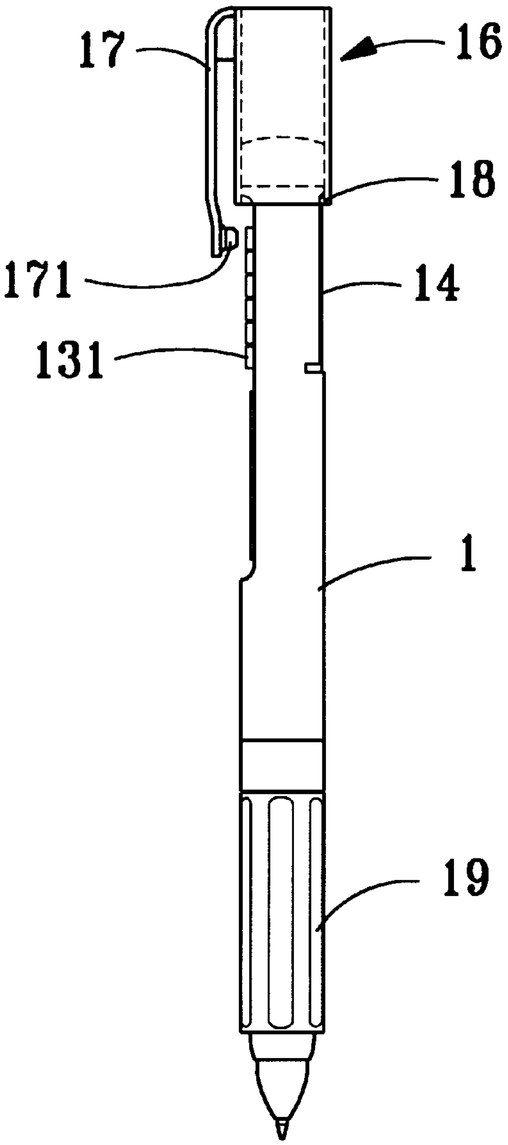
FIG. 3A and 3B show plan construction of an electronic pen calculator of this invention.
Figure 3B:
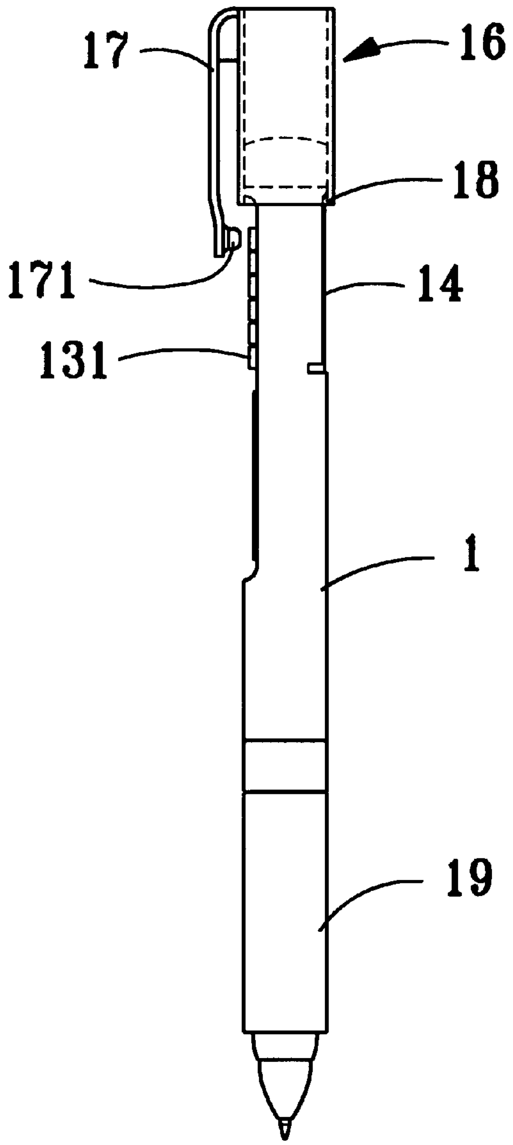

As shown in FIGS. 3A, 3B, after assembling, as the pen cap 16 is embedded in the T-groove 14, the pen cap 16 can slide within a rectangular scope ( scope of the keyboard 131) without escaping that facilitates a "in position" press. The slipping-resist sleeve 19 is sleeve-jointed onto bottom end of the pen body 1 a writing hand from slipping.

Figure 4:
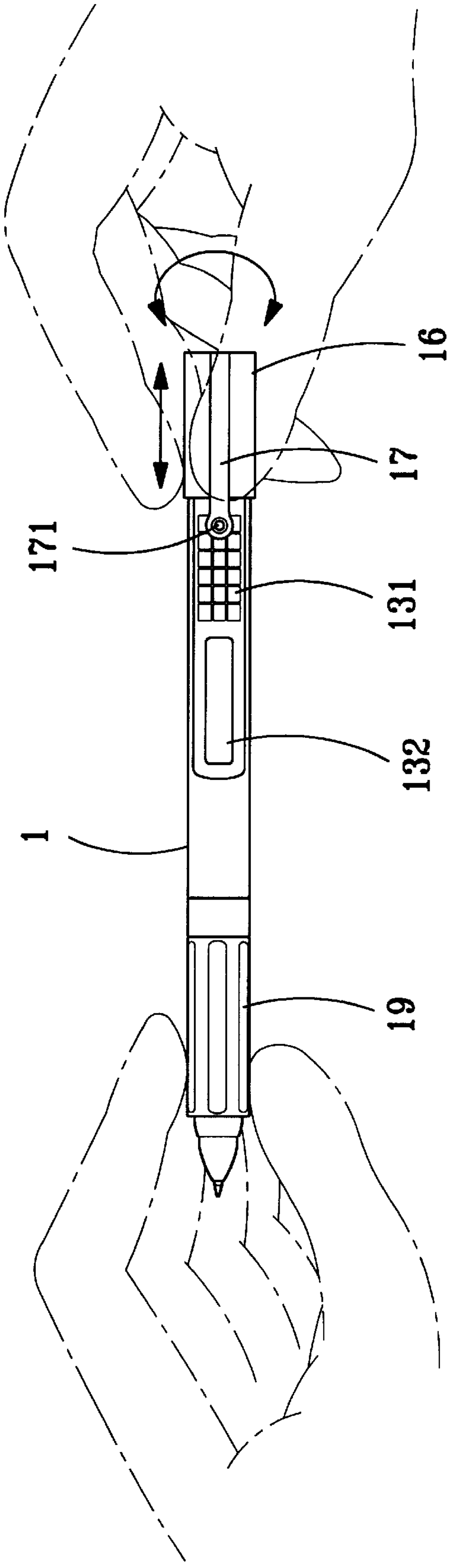
FIG. 4 is an embodiment operational diagram of an electronic pen calculator of this invention.

FIG. 4 illustrates an embodiment operation, wherein a user holds at the slipping-resist sleeve 19 with one hand and the pen cap 16 with the other, and slides the cap to the right, left, up, or down to position the protruded dot 171 of the clamping rod 17 on desired keys, then presses them for data input, the calculated result will be shown on the LCD 132. Just as its name says, this invention provides a dual functional operation for writing and calculating.

Merits of this invention may be concluded as:

1. Combination of two-in-one with a compact structure, same portability with a common pen, to write or to calculate as will.

2. Convenient data input. The protruded dot is designed for date input by sliding the pen cap to position a correct key, the answer will be shown on the LCD window.

3. Function enlargement possible. Functions of the printed circuit board can be enlarged, such as audio recorder, IF remote control, or key memory, etc.

In the above described, at least one preferred embodiment has been elucidated with reference to relating drawings annexed, it is apparent that numerous variations or modifications may be made without departing from the true spirit and scope thereof, as set forth in the following claims.

What is claimed is:

1. A structure of electronic pen calculator, comprising:

- a pen body, wherein two rectangular windows are formed for accommodating a printed circuit board, and on back of said windows, a groove shaped in inverse character T with a wide body and a narrow head is provided;
- a pen cap being a hollow cylinder having a clamping rod coupled with laterally, wherein a protruded dot is formed on inner face at tail end of said clamping rod, and a stopping rib is provided at bottom edge on the other side of said pen cap;

a slipping-resist sleeve for preventing hand from slipping when writing;

a printed circuit board disposed behind said windows in said pen body;

a keyboard; and a LCD module;

disposing the printed circuit board in said pen body; exposing said keyboard and LCD over those two rectangular windows; sleeve-jointing said pen cap onto top end of said pen body; a stopping rib at bottom edge of said pen cap embedding in said inverse T-groove allowing said pen cap to slide to the right, left, up, or down within a regulated scope, whereby said protruded dot can be positioned above a desired key one after another and pressed for data input; said slipping-resist sleeve being sleeve-jointed onto bottom end of said pen body to prevent hand from slipping when writing; providing a dual function of writing and calculating.

2. The structure of electronic pen calculator of claim 1, wherein said printed circuit board can be a calculating printed circuit board.

3. The structure of electronic pen calculator of claim 1, wherein said printed circuit board can be a circuit board for audio recording, IR remote control, or push button memory.

* * * * *